(12) United States Patent
Ikuta et al.

(10) Patent No.: US 7,230,695 B2
(45) Date of Patent: Jun. 12, 2007

(54) DEFECT REPAIR DEVICE AND DEFECT REPAIR METHOD

(75) Inventors: Yoshiaki Ikuta, Guilderland, NY (US); Toshiyuki Uno, Guilderland, NY (US)

(73) Assignee: Asahi Glass Company, Ltd., Tokyo (JP)

( * ) Notice: Subject to any disclaimer, the term of this patent is extended or adjusted under 35 U.S.C. 154(b) by 390 days.

(21) Appl. No.: 10/885,641

(22) Filed: Jul. 8, 2004

(65) Prior Publication Data

US 2006/0007433 A1    Jan. 12, 2006

(51) Int. Cl.
*G01N 21/00* (2006.01)
*G03H 3/00* (2006.01)

(52) U.S. Cl. .......................... 356/237.2; 430/5
(58) Field of Classification Search .................. None
See application file for complete search history.

(56) References Cited

U.S. PATENT DOCUMENTS

| | | | |
|---|---|---|---|
| 6,340,543 B1 * | 1/2002 | Nagamura et al. | 430/5 |
| 6,465,272 B1 | 10/2002 | Davis, Jr. et al. | |
| 6,576,380 B2 | 6/2003 | Davis, Jr. et al. | |
| 6,590,182 B1 * | 7/2003 | Domae | 219/121.69 |
| 6,605,392 B2 | 8/2003 | Matsumoto et al. | |
| 6,723,475 B2 | 4/2004 | Tsukamoto et al. | |
| 6,737,201 B2 | 5/2004 | Shoki et al. | |
| 6,821,682 B1 * | 11/2004 | Stearns et al. | 430/5 |
| 6,884,999 B1 * | 4/2005 | Yedur et al. | 250/306 |
| 2003/0164949 A1 | 9/2003 | Taylor et al. | |
| 2003/0207184 A1 * | 11/2003 | Smith | 430/5 |
| 2005/0032285 A1 * | 2/2005 | Imahara et al. | 438/166 |
| 2005/0254045 A1 * | 11/2005 | Weiss et al. | 356/237.5 |
| 2006/0007433 A1 | 1/2006 | Ikuta et al. | |

FOREIGN PATENT DOCUMENTS

WO    WO 02/27404 A2    4/2002

OTHER PUBLICATIONS

Barty A. et al.: "EUVL Mask Blank Repair", Emerging Lithographic Technologies VI, Proceedings of SPIE vol. 4688 (2002), pp. 385-394.
Stivers A. et al.: "Evaluation of the Capability of a Multibeam Confocal Inspection System for Inspection of EUVL Mask Blanks", 22nd Annual BACUS Symposium on Photomask Technology, Proceedings of SPIE, vol. 4889 (2002), pp. 408-417.

(Continued)

*Primary Examiner*—Michael P. Stafira
(74) *Attorney, Agent, or Firm*—Oblon, Spivak, McClelland, Maier & Neustadt, P.C.

(57) ABSTRACT

A defect repair device includes a defect inspection unit configured to find a size of a protruding defect on a front surface of a multi-layer film having a rear surface opposite to the front surface, a calculation unit configured to calculate a repair energy so as to repair the protruding defect based on the size of the protruding defect found by the defect inspection unit, an energy supplier, and an energy controller configured to control the energy supplier to supply the repair energy calculated by the calculation unit to a portion in the multi-layer film from the rear surface of the multi-layer film so as to cause a decrease in a volume of the portion and retract the protruding defect into the multi-layer film.

31 Claims, 6 Drawing Sheets

OTHER PUBLICATIONS

Ko Y. et al.: "Simulation of Repairing Thin Film Defect in Masks for EUV Lithography", Metrology, Inspection, and Process Control for Microlithography XVII, Proceedings of SPIE vol. 5038 (2003), pp. 293-302.

U.S. Appl. No. 11/330,205, filed Jan. 12, 2006, Ikuta et al.

Stefan P. Hau-Riege, et al., "Correction of figure errors on optical surfaces by laser-induced contraction of Mo/Si multilayers", Optics Letters, XP-002367868, vol. 28, No. 6, Mar. 15, 2003, pp. 456-458.

D. G. Stearns, "Thermally induced structural modification of Mo-Si multilayers", Journal of Applied Phisics, XP-002212713, vol. 67, No. 5, Mar. 1, 1990, pp. 2415-2427.

* cited by examiner

DEFECT REPAIR DEVICE AND DEFECT REPAIR METHOD

BACKGROUND OF THE INVENTION

1. Field of the Invention

The present invention relates to a defect repair device and a defect repair method.

2. Discussion of the Background

In manufacturing semiconductor integrated circuits, an exposure tool is used to print fine circuit patterns on a reticle onto a wafer. In order to achieve higher integration and greater performance, integrated circuits are made to have even finer structures, and thus an exposure tool is required to print detailed circuit patterns on the wafer, obtaining a deep focal depth and high resolution. Accordingly, the use of exposure light with shorter wavelengths has been attempted. For example, exposure techniques using g-line, i-line, KrF excimer laser and ArF excimer laser have been developed, and their wavelengths are 436 nm, 365 nm, 248 nm and 193 nm, respectively. Among the light with even shorter wavelengths, there is extreme ultraviolet light (hereinafter, "EUV light") having a wavelength of about 13.4 nm.

The exposure tool utilizing the light with a longer wavelength such as ArF laser is provided with a set of lens that transmits and refracts the exposure light to form the desired pattern on the wafer. On the other hand, in extreme ultraviolet lithography (hereinafter, "EUVL") using EUV light for exposure, since the EUV light does not pass through any material that can be used in transmissive lens, the exposure tool is equipped with reflective mirrors that reflect the EUV light and guide the light to the wafer. In case of the reflective mirror including a multi-layer film (hereinafter, "ML film") formed on a substrate, it is desirable to use a reflective mirror having an ML film with a completely flat surface in order to achieve a precise control of amplitude and phase of the reflected EUV light, and no defects that would degrade the imaging quality in the pattern transfer of the exposure tool is tolerated on the reflective mirror. For example, according to *Evaluation of the Capability of a Multibeam Confocal Inspection System for Inspection of EUVL Mask Blanks* by Stivers et al., Proceedings of SPIE Vol. 4889, p. 408, (2002), in case of manufacturing a semiconductor integrated circuit with a feature size of 32 nm, a surface bump on the ML film having a height of 2 nm and a full width at half maximum of 60 nm becomes a critical defect in the manufactured semiconductor integrated circuit. Therefore, any defects caused by deformation or disruption in the layer structure of the ML film should be effectively repaired.

Among defects of a reticle or reflective mirrors, a phase defect is a type of defect that produces a modulation of the phase of the reflected field and is caused by the displacement of layers of the ML film due to the presence of a foreign object. A method of repairing such a phase defect is disclosed in *EUVL mask blank repair* by Barty et al., Proceedings of SPIE Vol. 4688, p. 385, (2002) (hereinafter, "Barty et al."). According to Barty et al., the portion around the phase defect is irradiated with an electron beam from the front surface of the ML film. However, since the ML film absorbs the electron beam to some extent, and optical properties of the ML film are controlled by about 20 to 30 layers from the front surface of the ML film, the Barty et al. technique applying the electron beam from the front surface may degrade the optical properties of the ML film.

SUMMARY OF THE INVENTION

According to one aspect of the present invention, a defect repair device includes a defect inspection unit, a calculation unit, an energy supplier and an energy controller. The defect inspection unit is configured to find a size of a protruding defect on a front surface of a multi-layer film having a rear surface opposite to the front surface. The calculation unit is configured to calculate a repair energy so as to repair the protruding defect, based on the size of the protruding defect found by the defect inspection unit. The energy controller is configured to control the energy supplier to supply the repair energy calculated by the calculation unit to a portion in the multi-layer film from the rear surface of the multi-layer film so as to cause a decrease in a volume of the portion and retract the protruding defect into the multi-layer film.

According to another aspect of the present invention, a defect repair method includes finding a size of a protruding defect on a front surface of a multi-layer film having a rear surface opposite to the front surface, calculating a repair energy so as to repair the protruding defect based on a found size of the protruding defect, and supplying a calculated repair energy to a portion in the multi-layer film from the rear surface of the multi-layer film so as to cause a decrease in a volume of the portion and retract the protruding defect into the multi-layer film.

According to yet another aspect of the present invention, there is provided a computer readable media for controlling a computer to perform finding a size of a protruding defect on a front surface of a multi-layer film having a rear surface opposite to the front surface, calculating a repair energy so as to repair the protruding defect based on a found size of the protruding defect, and supplying a calculated repair energy to a portion in the multi-layer film from the rear surface of the multi-layer film so as to cause a decrease in a volume of the portion and retract the protruding defect into the multi-layer film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
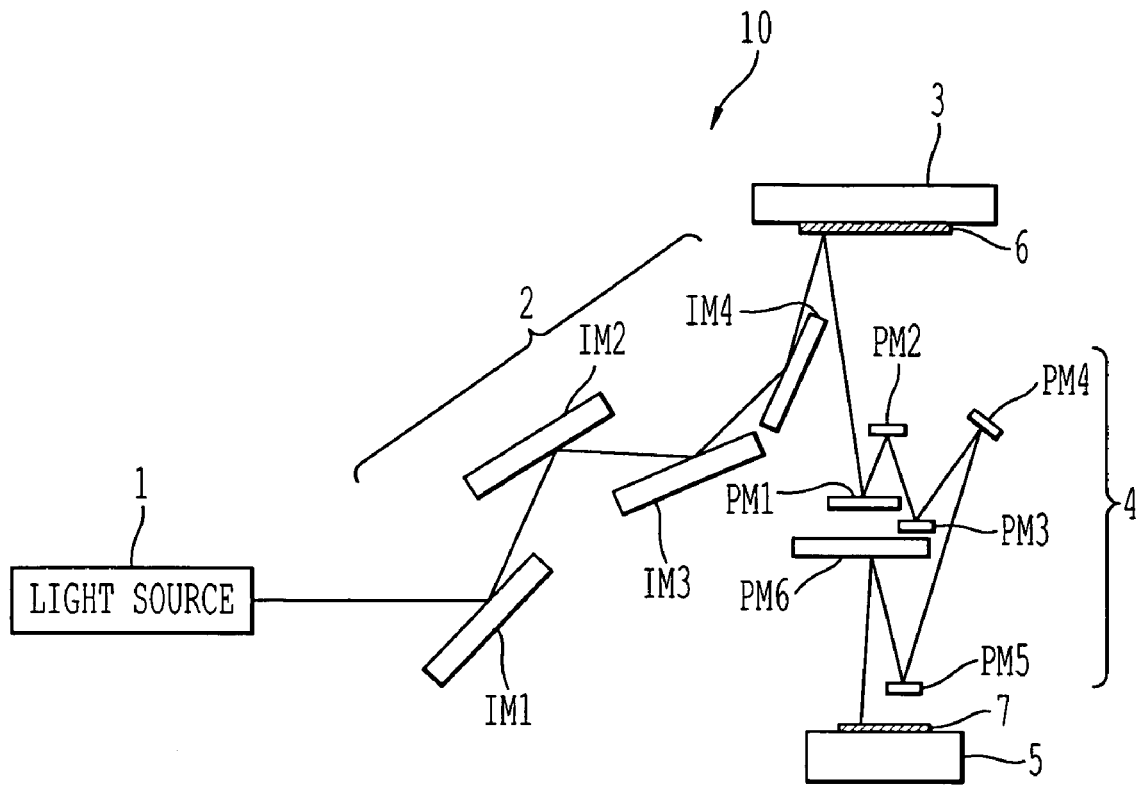
FIG. 1 is a schematic illustration of an exposure tool for extreme ultraviolet lithography.

The preferred embodiments will now be described with reference to the accompanying drawings, wherein like reference numerals designate corresponding or identical elements throughout the various drawings.

FIG. 1 is a schematic illustration of an exposure tool for extreme ultraviolet lithography (hereinafter, "EUVL") utilizing extreme ultraviolet light (hereinafter, "EUV light") as exposure light source. As shown in FIG. 1, an exposure tool 10 includes a light source 1, an illumination mirror unit 2, a reticle stage 3, a projection mirror unit 4 and a wafer stage 5. The light source 1 is configured to emit exposure light having a desired wavelength, for example, about 13 nm in EUVL. The illumination mirror unit 2 includes reflective mirrors IM1–IM4 each configured to reflect incident light, and the finally-reflected light reaches a reticle 6 provided on the reticle stage 3 and uniformly illuminates the reticle 6. The reticle 6 has a circuit pattern to be formed on a wafer 7 disposed on the wafer stage 5. The projection mirror unit 4 includes reflective mirrors PM1–PM6 each configured to reflect the incident light so as to guide the light reflected on the reticle 6 to the wafer 7, and the circuit pattern on the reticle 6 is projected onto the wafer 7 through reduction projection.

Figure 2:
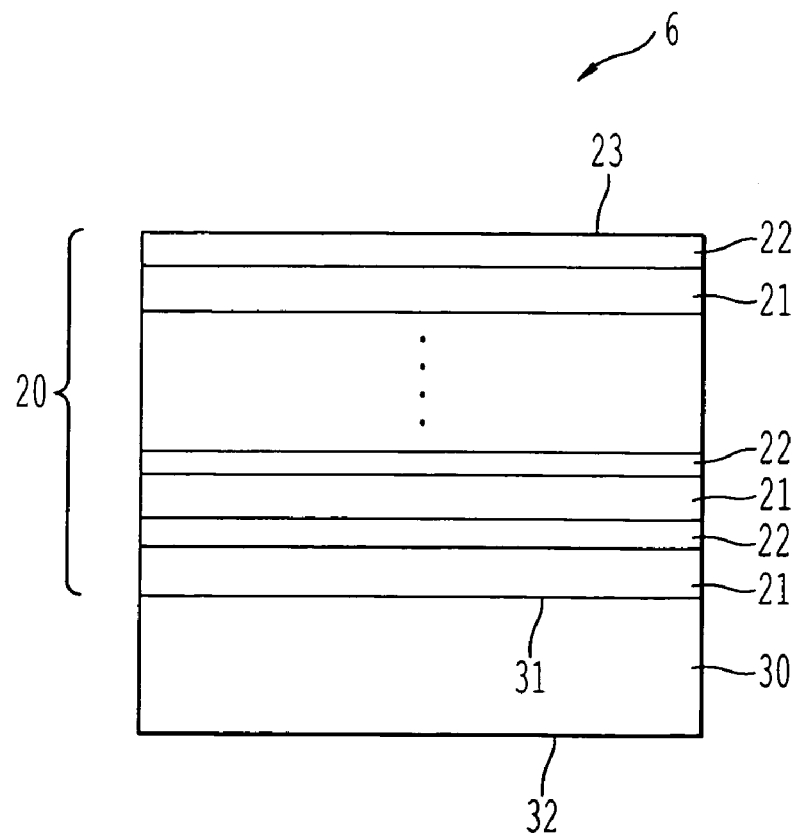
FIG. 2 is a cross-sectional view of a reticle used in the exposure tool for extreme ultraviolet lithography.

Referring to FIG. 2, the structure of the reticle 6 will be discussed. The reticle 6 includes a multi-layer film (hereinafter, "ML film") 20 formed on a front surface 31 of a substrate 30, and the ML film 20 is configured to reflect the EUV light on a front surface 23. In the present embodiment, the ML film 20 includes multiple Si layers 21 and Mo layers 22 alternately formed. The ML film 20 may include other paired layers such as Ru/Si, Mo/Be and Si/Nb. Also, the ML film 20 may include layers of more than two kinds such as Si/Mo/Ru and Si/Mo/Ru/Mo. Depending on the materials of the ML film 20, the thickness of the ML film 20 is optimized to obtain the highest reflectance at the wavelength of interest. The substrate 30 preferably includes a material having a relatively small coefficient of thermal expansion and a relatively large transmittance at the wavelength of the light source used for the defect repair. One example of such a material is synthetic quartz glass with a coefficient of thermal expansion of about 1 ppm/K at around 25° C., and another example is low thermal expansion glass with a coefficient of thermal expansion of less than 10 ppb/K at around 25° C. The substrate 30 may have an electronic conductive film formed on a rear surface 32 so that the reticle 6 can be fixed on the reticle stage 3 by electrostatic chucking. The electronic conductive film preferably has a sheet resistance of 100 Ω or less, and such an electronic conductive film may be formed before or after repairing a defect if there is any. In case of forming the electronic conductive film before the defect repair, materials that have desirable transmission at the wavelength of the light to be used in the repair and a good chemical resistance as well as greater mechanical strength are preferable. For example, materials with relatively low electric resistance such as Au, Cu, Al and Ni, semiconductor materials such as Si, and other materials having suitable conductivity for effective electrostatic chucking may be used alone or in combination. In case of forming the electronic conductive film after the defect repair, materials such as Cr, TaSi, TiN, and Si and other materials having desirable conductivity may be used.

Figure 3A:
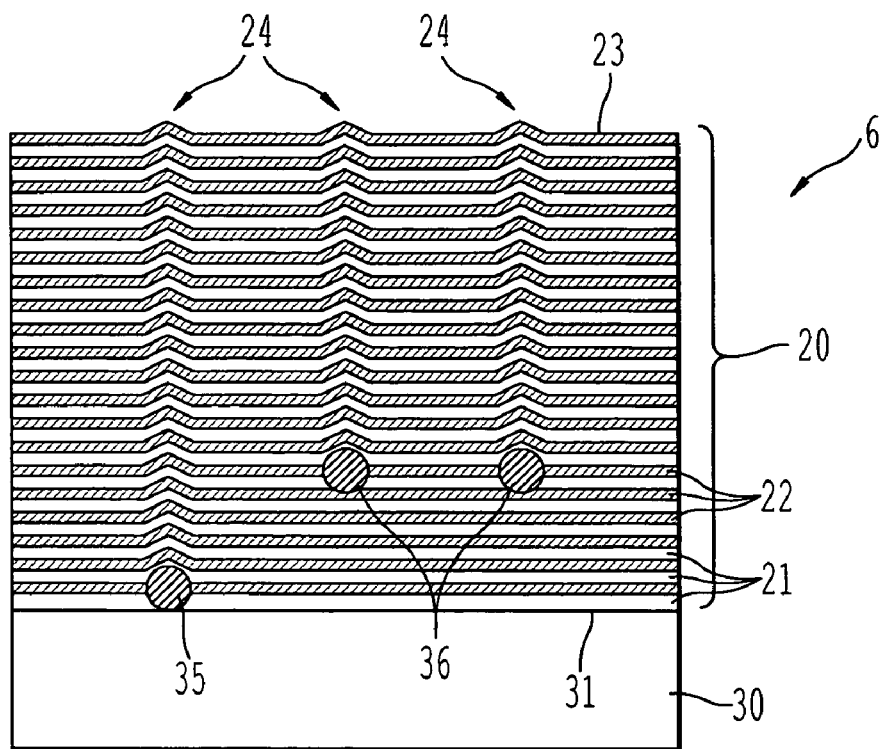
FIG. 3A is an illustration of the reticle having a phase defect.
Figure 3B:
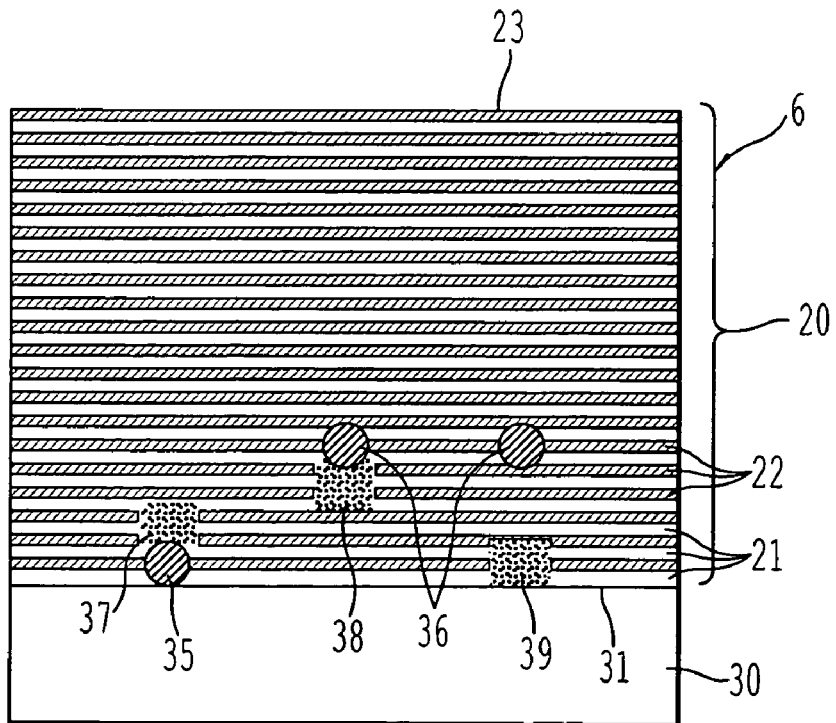
FIG. 3B is an illustration of the reticle after the phase defect is repaired.

Incidentally, the reticle 6 may have defects if foreign objects are contaminated in the ML film 20 or at the interface between the ML film 20 and the substrate 30. Such defects are called phase defects and illustrated in FIG. 3A. When a foreign object 35 exists on the front surface 31 of the substrate 30 or when defects such as foreign objects 36 are contaminated in the ML film 20, layers of the ML film 20 are displaced, and the front surface 23 of the ML film 20 becomes non-flat because of surface bumps or protruding defects 24 as shown in FIG. 3A, which cause phase defects in the reticle 6. When the exposure light is reflected on such a reticle, the phase of the field of the reflected light is modulated, and thus a desired pattern cannot be formed onto the wafer. Also, since the light reflectance is influenced by the film structure of the 20–30 layers from the reflective surface, the deformation of the multi-layer structure may damage the optical property of the reticle. By using a device and method for repairing a defect according to the current embodiment of the present invention, the surface bumps or the protruding defects 24 caused by the defects in the reticle 6 are retracted into the ML film 20, and the flatness of the front surface 23 and the film structure above the repaired portion, which would influence the light reflectance, are improved as shown in FIG. 3B. Specifically, the protruding defects 24 are repaired by irradiating portions 37–39 in the ML film 20 with high-energy light incident from the rear surface 32 of the substrate 30 so as to supply energy to induce a chemical reaction between Mo and Si to form $MoSi_x$ where x is an integer. Here, the portions 37 and 38 are located near the foreign objects 35 and 36 in FIG. 3B, but the portions that receive the repair energy to cause the volume decrease may be other portions in the ML film 20, for example, the portion 39 located near the boundary between the ML film 20 and the substrate 30, if the front surface 23 of the ML film 20 is apart from the portions that receive the repair energy and the energy does not produce negative effects on the front surface 23. The irradiated portion including $MoSi_x$ thus formed has a smaller specific volume than unirradiated portions, and therefore the repair method according to this embodiment of the present invention allows the compensation of the deformation and/or disruption of the ML film 20 located above the irradiated portion. Since the ML film 20 above the irradiated portion is not subject to direct irradiation with the high-energy light, the damage to optical properties such as peak reflectivity and centroid wavelength is minimized by this irradiation technique. Hence, according to this embodiment of the present invention, the optical properties of the reticle 6 are not adversely affected by the irradiation, and thus defects are effectively repaired by the irradiation without causing any damages on the ML film 20, such as a reflection loss and a deformation of the multi-layer structure, by using a device and method for repairing a defect according to the present embodiment of the present invention. More details of the defect repair device and method will be described below.

Figure 4:
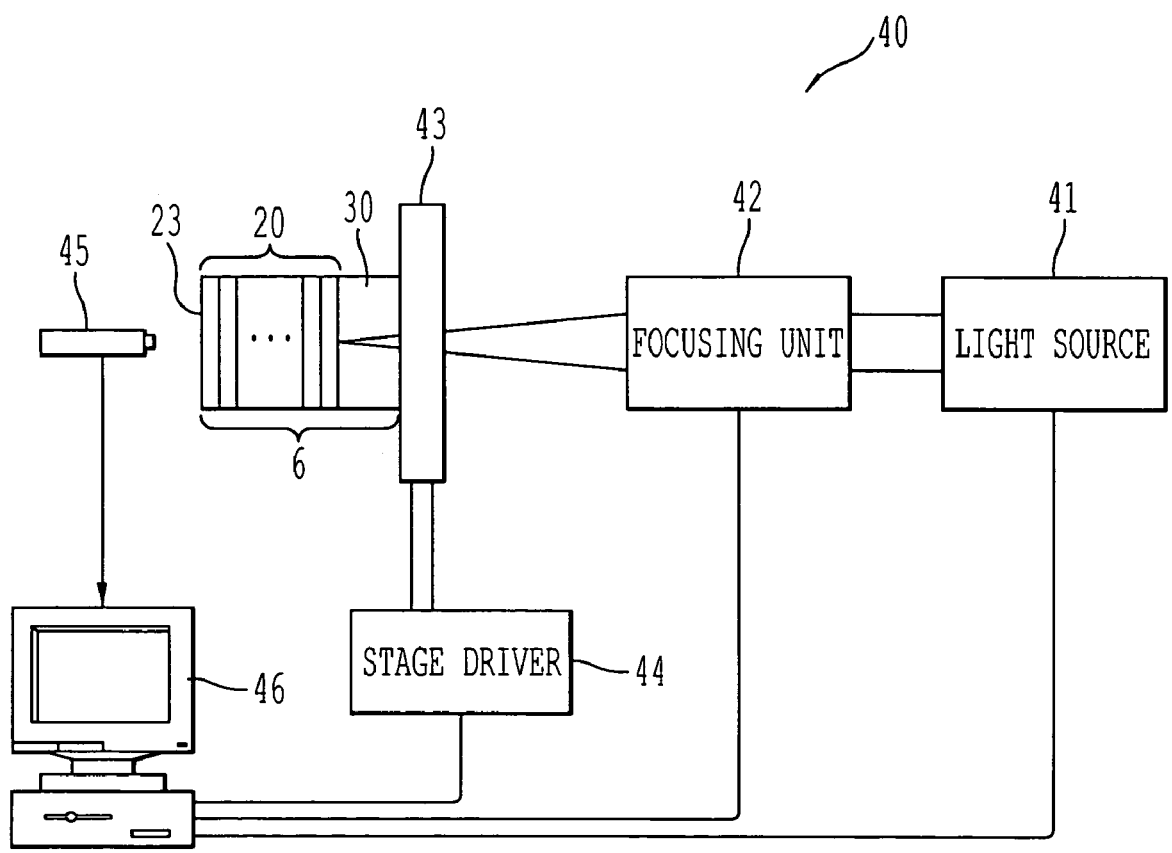
FIG. 4 is a defect repair device according to one embodiment of the present invention.

FIG. 4 shows a defect repair device according to one embodiment of the present invention. A defect repair device 40 includes a light source 41, a focusing unit 42, a stage 43, a stage driver 44, a detection unit 45, and a controller 46. The light source 41 is configured to emit irradiation light which illuminates the reticle 6 positioned on the stage 43. The focusing unit 42 is configured to focus the irradiation light so as to form a spot with a desirable size at a target position in the reticle 6. The film on the rear surface of the substrate 30 as well as the substrate 30 itself may have some optical absorption of the light used for the defect repair. Such light absorption would cause the increase in temperature during the irradiation, and the temperature increase of the substrate 30, especially near the boundary between the substrate 30 and the ML film 20, might induce the volume change of the ML film 20 at undesired portions due to the formation of $MoSi_x$. Since the temperature increase depends on the energy density of the applied light, the irradiation area outside the spot preferably has a large area to decrease the energy density. Therefore, the focusing unit 42 is preferably used in order to have a high energy density at the spot and a decreased energy density in the rest of the irradiated portion. When the desired spot diameter is longer than the wavelength of the irradiation light emitted from the light source 41, the focusing unit 42 may be omitted. In order to obtain a spot with a diameter shorter than the wavelength of the irradiation light, a lens and/or a mask may be included in the focusing unit 42. In case of employing a lens, the spot size can be adjusted by changing the magnification of the lens. The lens preferably has a magnification within a range from twice (2×) to 50 times (50×). When the focusing unit 42 includes a mask, the light spot size is adjustable by using a mask with an aperture of a proper size. Such a mask and a lens may be utilized at the same time. For instance, by using a mask with an aperture diameter of 1200 nm together with a 4×-reduction lens, a spot having a diameter of 300 nm can be obtained. Also, in order to achieve a spot with a diameter shorter than the wavelength of the irradiation light, a mask for improving the resolution such as a phase shift mask and a Cr-less mask may be utilized. For example, a phase-shift mask may have an aperture in the center portion, and the surrounding portion may be a half-tone portion which provides a light transmission of 8% and a phase shift of 180 degree. Such a phase shift mask allows a high resolution spot achieving a clear distinction by the light amplitude between inside and outside of the spot. As shown in FIG. 4, the stage 43 holds the reticle 6 vertically in the defect repair device 40 according to the current embodiment of the invention. Such a vertical holding is more desirable for avoiding deformation of the reticle 6 or other adverse effects caused by the weight of the reticle 6. The stage 43 may hold the reticle 6 by mechanical chucking, vacuum chucking, electrostatic chucking and other methods that allow accurate positioning of the reticle 6. As a positioning unit, the stage driver 44 is configured to position the reticle 6 by moving the stage 43 in x, y and z directions so that the irradiation light forms a spot at a desired position in the reticle 6. The detection unit 45 is configured to detect the sizes of defects in the reticle 6, and the data of the detected defect are stored in the controller 46. Here, the controller 46 may receive from the detection unit 45 raw measurement data such as the position, height and full width at half maximum of the defect and calculate an equivalent diameter of the defect is calculated based on the measurements. Alternatively, the detection unit 45 may calculate an equivalent diameter such as the polystyrene-latex-equivalent diameter of the detected defect and then provide the obtained data to the controller 46. For example, the detection unit 45 may include a surface-imaging unit configured to obtain an image of the front surface 23 so as to obtain quantitative measurements of defects, or the detection unit 45 may include other defect detectors that can calculate equivalent diameters of the detected defects. The controller 46 is configured to control the light source 41, the focusing unit 42 and the stage driver 44 so as to find defects in the reticle 6 and effectively repair the defects. More specifically, the controller 46 first controls the detection unit 45 to scan the front surface 23 of the reticle 6 and search for defects. When defects are detected, the controller 46 calculates the size of the defect, and then, based on the defect size, the controller 46 calculates the repair energy to be supplied to the reticle 6 for the defect repair. The controller 46 then controls the stage driver 44 to position the reticle 6 by moving the stage 43 so as to form a spot in the reticle 6 at a desired position. Also, if the defect repair device 40 includes the focusing unit 42, the controller 46 controls the focusing unit 42 to obtain a desired spot size depending on the defect size. Here, the position of the spot may be at the interface between the substrate 30 and the ML film 20, or other positions as long as the repair energy supplied to the reticle 6 does not produce adverse effects on the front surface 23 of the ML film 20. Subsequently, the controller 46 controls the light source 41 to perform the irradiation of the reticle 6 so as to supply the calculated repair energy to the reticle 6. Details of the operation of the controller 46 are discussed below.

Figure 5A:
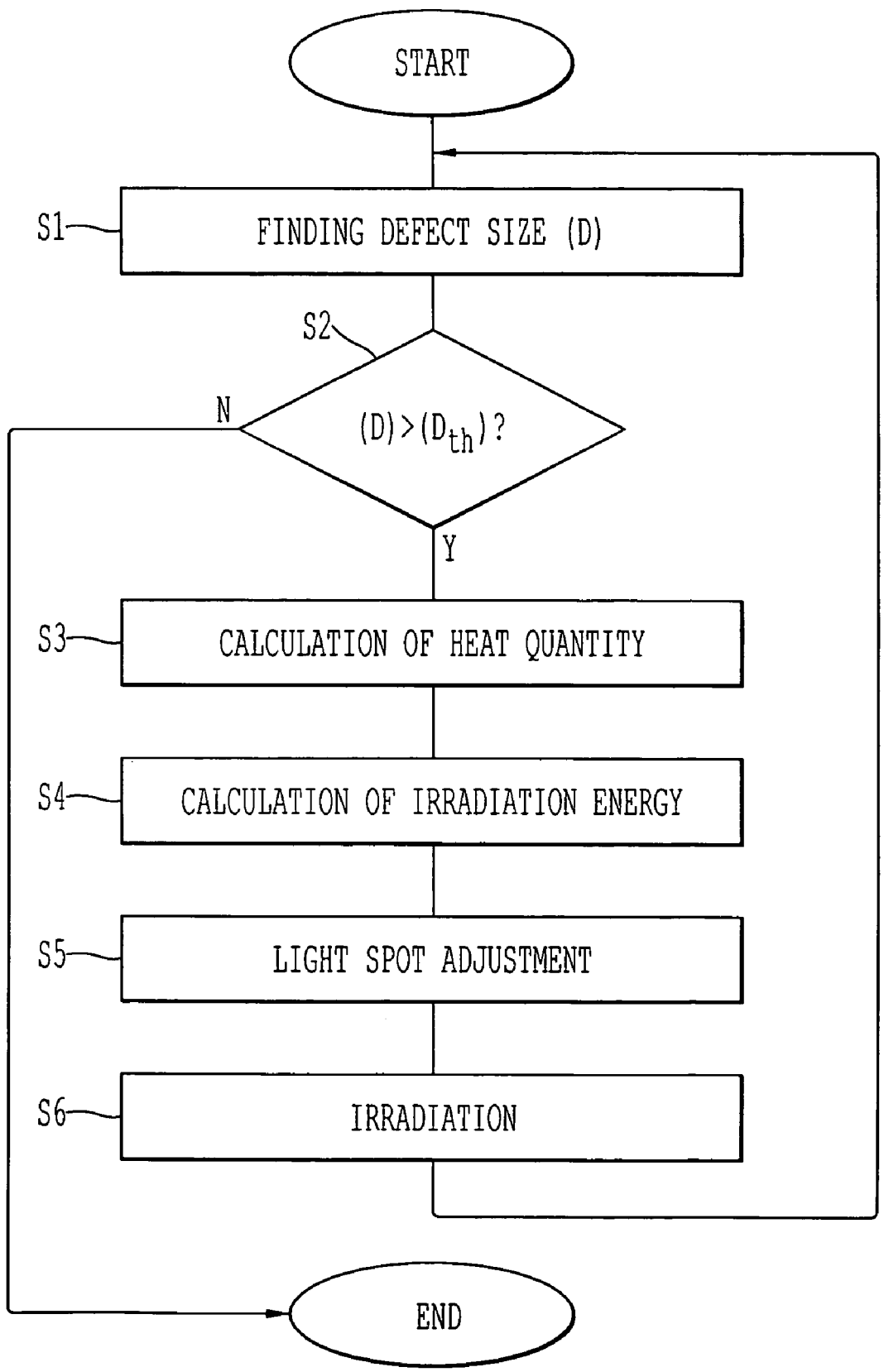
FIG. 5A is a flowchart showing one example of operational steps of a controller in the defect repair device.

FIG. 5A is a flowchart showing one example of the irradiation control of the controller 46. Referring to FIGS. 4 and 5A, a defect repair method according to the current embodiment of the present invention will be discussed. When the detection unit 45 detects protruding defects on the front surface 23 of the reticle 6, the controller 46 as a defect inspection unit finds the size (D) of the protruding defect (step S1). In this embodiment, for example, the equivalent diameter ($D_{eq}$) of the defect, i.e., the diameter of a sphere having substantially the same volume as the defect, is obtained and used as the defect size (D). One method of obtaining the equivalent diameter ($D_{eq}$) is to detect a height (h) and a full width at half maximum (FWHM) (w) of the defect by using a device such as an atomic force microscope (AFM), and then calculate the equivalent diameter ($D_{eq}$) according to the following equation (1):

$$D_{eq}=2*(0.849*w*h/(2\pi)^{0.5})^{0.5}. \tag{1}$$

In this case, it is supposed that the cross section of the detected defect has a Gaussian distribution shape. Alternatively, a polystyrene-latex-equivalent diameter of the detected defect may be calculated and used as the defect size (D). The method of finding the size of the defect is not limited to these methods, and other direct and indirect methods may be employed. After the step S1, the controller 46 as a comparison unit compares the defect size (D) with a predetermined threshold value ($D_{th}$), and determines whether to conduct the defect repair (step S2). If (D) is larger than ($D_{th}$), the controller 46 proceeds to the next repair step; otherwise, the controller 46 finishes the defect repair operation. Here, the threshold value ($D_{th}$) may be determined depending on the size of the circuit to be manufactured. After finding the defect size (D), the controller 46 determines irradiation conditions based on the finding. For instance, in this embodiment, the controller 46 calculates heat quantity (Q) in step S3 according to the following equation (2):

$$Q=(4\pi(D/2)^3/3)*\rho*Cp\Delta T, \tag{2}$$

where ($\rho$) is the density of the ML film, (Cp) is the heat capacity of the ML film, and ($\Delta T$) is the target increase in temperature. In the case of Mo/Si layers where each Mo layer has a thickness of about 3 nm and each Si layer has a thickness of about 4 nm, ($\rho$) is about 5.48 g/cm$^3$, and (Cp) is about 0.53 J/g/K. Also, ($\Delta T$) can be set to about 200–300° C., since the formation of MoSi$_2$ is promoted at a temperature of about 200° C. or higher. The values for the variables in the above equation may be adjusted depending on the materials of the ML film, thickness, and so on. Also, the above equation (2) may be modified as:

$$Q=(4\pi(D/2)^3/3)*\rho*(Cp\Delta T+\Delta E), \tag{2'}$$

in order to consider the reaction energy ($\Delta E$) for the formation of MoSi$_x$ per unit weight. Next, in step S4, the controller 46 as a calculation unit calculates the repair energy based on the obtained heat quantity. In the present embodiment, the controller 46 calculates the irradiation energy density (E) at the focal spot of the irradiation light by using the following equation (3):

$$E=Q/t/\epsilon/(\pi D^2/4), \tag{3}$$

where (t) is the length of the irradiation, and (ε) is the loss of the irradiation light energy due to the effects such as loss in reflection and absorption by the substrate 30 and/or a film formed on the rear surface 32 of the substrate 30. For example, (t) may be less than 5 seconds and more preferably less than 3 seconds in order to avoid heat diffusion to portions surrounding the repaired portion in the ML film and temperature increase due to the heat. Also, (ε) is about 0.9 to 0.95, for example, in the case of irradiating a reticle having no layer formed on the rear surface with KrF excimer laser light. Then, in step S5, the controller 46 controls the stage driver 44 to position the reticle 6 by moving the stage 43 so as to form a spot in the reticle 6 at a desired position. Also, the controller 46 controls the focusing unit 42 to obtain a desired spot size depending on the defect size (D). Here, the spot size may be substantially equal to the defect size (D). In step S6, the controller 46 as an energy controller controls the light source 41 (energy supplier) to perform the irradiation for the time length (t) to supply the repair energy as determined in step S3 to the ML film. The operation of the controller 46 then goes back to step S1 where the defect size (D) after the irradiation is examined. Until the defect size (D) becomes equal to or less than the threshold value ($D_{th}$), the controller 46 repeats the cycle of the steps described above. In each cycle, the values set to the variables in the above equations, for example, ΔT and t may be altered or the same. In the above method, after the controller 46 finishes the step S6, the defect size (D) altered by the irradiation is again measured in step S1. However, the defect size (D) after the irradiation may be found by using other methods. For instance, the height of the defect after each irradiation may be calculated or estimated based on the height of the defect at the beginning of each irradiation cycle as well as the factors such as irradiation conditions and material of the ML film 20. For example, in the case of Mo/Si layers where each Mo layer has a thickness of about 3 nm and each Si layer has a thickness of about 4 nm, and assuming that $MoSi_2$ is formed by the reaction of Mo and Si, the height (h') of the protruding defect after each irradiation may be calculated by using the following formula (4):

$$h'=h-(2.1/7)*D=h-0.3D, \qquad (4)$$

since the contraction caused by the formation of $MoSi_2$ per each Mo/Si pair is about 2.1 nm if the Si layer completely reacts with the Mo layer.

The values set to the variables in the equations (2), (2') and (3) may be varied by modifying a certain value (for example, a value larger than one) to the last value used in the equation in order to reduce the number of cycles and perform more efficient defect repair. Alternatively, the values of the variables in the above equations may be adjusted in a more flexible manner. Also, modifications may be made to the above-mentioned equations, for instance, in order to consider other factors such as heat diffusion to non-irradiated portions in the ML film.

Figure 5B:
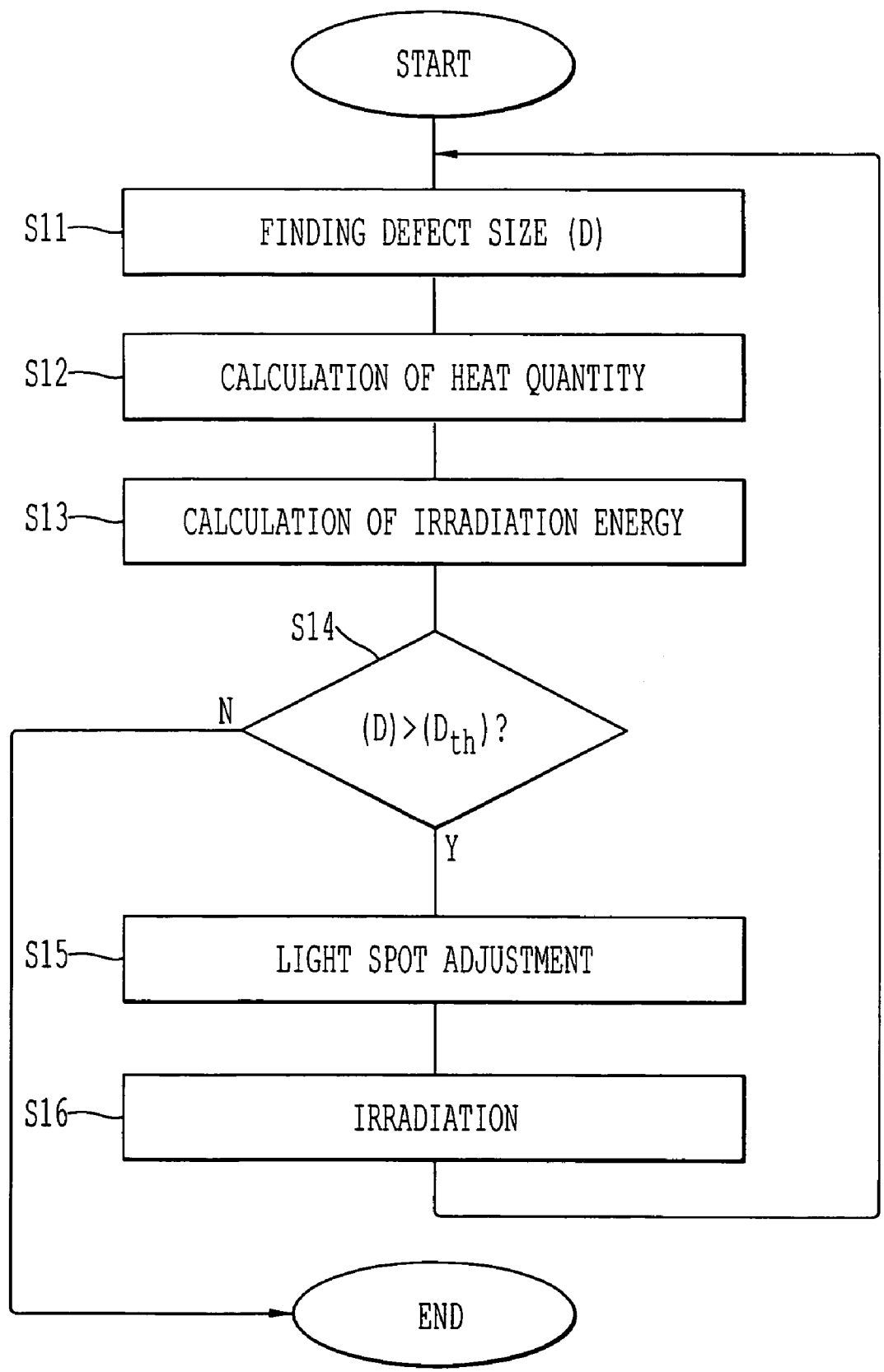
FIG. 5B is a flowchart showing another example of operational steps of a controller in the defect repair device.
Figure 6:
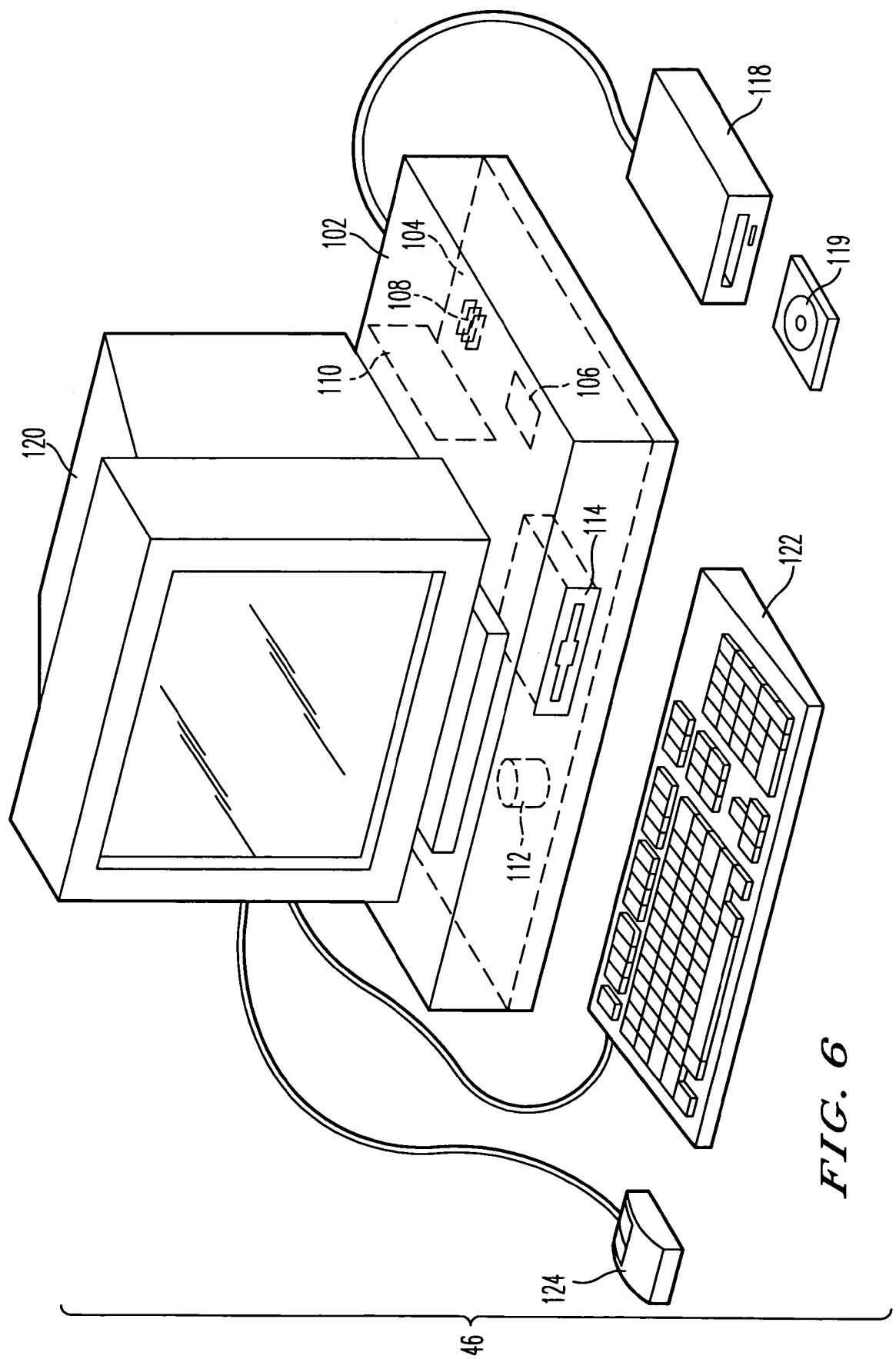
FIG. 6 is a schematic illustration of the controller.

FIG. 5B is a flowchart showing another example of the irradiation control of the controller 46. As shown in this example, the controller 46 may perform the operational steps of FIG. 4B in a different order. Specifically, after the controller 46 calculates the irradiation energy based on the size of the protruding defect (steps S11–S13), the controller 46 determines whether the size of the protruding defect is larger than the threshold value (steps S14), and then performs the irradiation control as described above in order to repair the defect (steps S15 and S16).

The device and method of repairing defects described above is not limited to repairing phase defects of a reticle, but is applicable to repairing defects of various types of substrates. For example, defects of the reflective mirrors used in the exposure tool may be repaired in the similar manner.

With regard to the irradiation light, the repair device and method of this embodiment of the present invention may employ any type of light that passes through the substrate 30 of the reticle 6 at a higher transmission, for example, 50% or more, but is at least partly absorbed by the ML film 20. In other words, the transmission of the irradiation light through the ML film 20 is lower, for example, 50% or less with respect to each pair layer of the ML film 20. For instance, any light that has a wavelength in the range from ultraviolet to near infra-red may be utilized. Examples of such light are not limited to but include ArF excimer laser light (wavelength: 193 nm), KrF excimer laser light (248 nm), $4^{th}$ harmonic YAG laser (266 nm), XeCl excimer laser (308 nm), $2^{nd}$ harmonic YAG laser (532 nm), Nd:YAG laser (1032 nm), and femtosecond super-short pulse lasers such as titanium sapphire laser (800 nm) and $3^{rd}$ harmonic of a titanium sapphire laser (258 nm).

As shown in FIG. 4, the defect repair device 40 according to the current embodiment of the present invention employs the light source 41 as an energy supplier which supplies the repair energy to the ML film 20 of the reticle 6. However, the energy supplier is not limited to such a light supplier, and the defect repair device 40 may include other devices capable of providing energy or heat which causes a chemical reaction or change in physical properties in the ML film 20 that allows the effective retraction of protruding defects into the ML film 20 without producing damages or negative effects on the front surface 23 of the ML film 20.

FIG. 7 is a schematic illustration of the controller 46. In this embodiment, the controller 46 is, for example, a computer system. The computer system 46 implements the method of the present embodiment according to the invention, wherein the computer housing 102 houses a motherboard 104 which contains a CPU 106, memory 108 (e.g., DRAM, ROM, EPROM, EEPROM, SRAM, SDRAM, and Flash RAM), and other optional special purpose logic devices (e.g., ASICs) or configurable logic devices (e.g., GAL and reprogrammable FPGA). The computer system 19 also includes plural input devices, (e.g., a keyboard 122 and mouse 124), and a display card 110 for controlling monitor 120. In addition, the computer system 100 further includes a floppy disk drive 114; other removable media devices (e.g., compact disc 119, tape, and removable magneto-optical media (not shown)); and a hard disk 112, or other fixed, high density media drives, connected using an appropriate device bus (e.g., a SCSI bus, an Enhanced IDE bus, or a Ultra DMA bus). Also connected to the same device bus or another device bus, the computer system 19 may additionally include a compact disc reader 118, a compact disc reader/writer unit (not shown) or a compact disc jukebox (not shown). Although compact disc 119 is shown in a CD caddy, the compact disc 119 can be inserted directly into CD-ROM drives which do not require caddies.

As stated above, the system includes at least one computer readable medium. Examples of computer readable media are compact discs 119, hard disks 112, floppy disks, tape, magneto-optical disks, PROMs (EPROM, EEPROM, Flash EPROM), DRAM, SRAM, SDRAM, etc. Stored on any one or on a combination of computer readable media, the present embodiment of the invention includes software for controlling both the hardware of the computer 100 and for enabling the computer 100 to interact with a human user. Such software may include, but is not limited to, device drivers, operating systems and user applications, such as development tools. Such computer readable media further includes the computer program product of the present embodiment according to the invention for changing a temperature of the membrane from a first temperature to a second temperature; finding a first resonance frequency of the membrane at the first temperature and a second resonance frequency of the membrane at the second temperature; and calculating the internal stress based on the first and second resonance frequencies. The computer code devices of the present embodiment of the invention can be any interpreted or executable code mechanism, including but not limited to scripts, interpreters, dynamic link libraries, Java classes, and complete executable programs.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A defect repair device comprising:
   a defect inspection unit configured to find a size of a protruding defect on a front surface of a multi-layer film having a rear surface opposite to the front surface;
   a calculation unit configured to calculate a repair energy so as to repair the protruding defect, based on the size of the protruding defect found by the defect inspection unit;
   an energy supplier; and
   an energy controller configured to control the energy supplier to supply the repair energy calculated by the calculation unit to a portion in the multi-layer film from the rear surface of the multi-layer film so as to cause a decrease in a volume of the portion and retract the protruding defect into the multi-layer film.

2. A defect repair device according to claim 1, wherein the energy supplier includes a light source configured to emit light to the multi-layer film.

3. A defect repair device according to claim 2, further comprising a focusing unit configured to focus the light emitted to the multi-layer film.

4. A defect repair device according to claim 1, further comprising:
   a comparison unit configured to determine whether the size of the protruding defect is larger than a threshold value, the energy controller being configured to control the energy supplier to supply the repair energy if the comparison unit determines that the size of the protruding defect is larger than the threshold value.

5. A defect repair device according to claim 4, wherein the defect inspection unit is configured to find an altered size of the protruding defect after the energy supplier supplied the repair energy, and wherein the energy controller is configured to control the energy supplier to supply the repair energy if the comparison unit determines that the altered size is larger than the threshold value.

6. A defect repair device according to claim 4, wherein the defect inspection unit is configured to find an altered size of the protruding defect after the energy supplier supplied the repair energy, wherein the calculation unit is configured to re-calculate a modified repair energy based on the altered size of the protruding defect if the comparison unit determines that the altered size is larger than the threshold value, and wherein the energy controller is configured to control the energy supplier to supply the modified repair energy.

7. A defect repair device according to claim 4, wherein the defect inspection unit is configured to find an altered size of the protruding defect after the energy supplier supplied the repair energy, wherein the calculation unit is configured to re-calculate a modified repair energy based on the altered size of the protruding defect, and wherein the energy controller is configured to control the energy supplier to supply the modified repair energy if the comparison unit determines that the altered size is larger than the threshold value.

8. A defect repair device according to claim 1, wherein the energy supplier is configured to supply the repair energy in a manner such that the front surface of the multi-layer film is apart from the portion to which the repair energy is supplied.

9. A defect repair device according to claim 1, wherein the defect inspection unit includes a surface-imaging unit configured to obtain an image of the front surface of the multi-layer film so as to find the size of the protruding defect.

10. A defect repair device according to claim 1, further comprising a positioning unit configured to position the multi-layer film.

11. A defect repair device according to claim 10, wherein the positioning unit positions the multi-layer film vertically.

12. A defect repair device according to claim 1, wherein the calculation unit is configured to calculate the repair energy based on an energy density (E) obtained by equations:

$$Q=(4\pi(D/2)^3/3)*\rho*Cp\Delta T \text{ and}$$

$$E=Q/t/\epsilon/(\pi D^2/4),$$

where (Q) is a heat quantity, (D) is the size of the protruding defect, (ρ) is a density of the multi-layer film, (Cp) is a heat capacity of the multi-layer film, (ΔT) is a target increase in temperature of the portion in the multi-layer film, (t) is a length of time for which the energy supplier supplies the repair energy, and (ε) is an energy loss.

13. A defect repair device according to claim 1, wherein the multi-layer film has layers of different types which are formed one onto another and includes a first layer and a second layer, and wherein the decrease in a volume of the portion in the multi-layer film is caused by a reaction which occurs at an interface between the first layer and the second layer due to the repair energy supplied by the energy supplier.

14. A defect repair device according to claim 13, wherein the first layer includes Si and the second layer includes Mo.

15. A defect repair device according to claim 1, wherein the front surface of the multi-layer film is a reflection surface.

16. A defect repair device according to claim 1, wherein the multi-layer film is formed on a substrate of a reticle.

17. A defect repair device comprising:
   defect size finding means for finding a size of a protruding defect on a front surface of a multi-layer film having a rear surface opposite to the front surface;
   calculation means for calculating a repair energy so as to repair the protruding defect, based on the size of the protruding defect found by the defect size finding means; and
   energy supplying means for supplying the repair energy calculated by the calculation means to a portion in the multi-layer film from the rear surface of the multi-layer film so as to cause a decrease in a volume of the portion and retract the protruding defect into the multi-layer film.

18. A defect repair method comprising:
finding a size of a protruding defect on a front surface of a multi-layer film having a rear surface opposite to the front surface;
calculating a repair energy so as to repair the protruding defect, based on a found size of the protruding defect; and
supplying a calculated repair energy to a portion in the multi-layer film from the rear surface of the multi-layer film so as to cause a decrease in a volume of the portion and retract the protruding defect into the multi-layer film.

19. A defect repair method according to claim 18, wherein the supplying of the calculated repair energy includes emitting light to the multi-layer film.

20. A defect repair method according to claim 18, wherein the supplying of the calculated repair energy includes making a temperature of the portion in the multi-layer film higher than about 200° C.

21. A defect repair method according to claim 18, further comprising determining whether the size of the protruding defect is larger than a threshold value, the calculated repair energy being supplied if the size of the protruding defect is larger than the threshold value.

22. A defect repair method according to claim 21, wherein the finding includes finding an altered size of the protruding defect after the repair energy is supplied, and wherein the calculated repair energy is supplied if the altered size of the protruding defect is larger than the threshold value.

23. A defect repair method according to claim 21, wherein the finding includes finding an altered size of the protruding defect after the repair energy is supplied, wherein the calculating includes re-calculating a modified repair energy based on the altered size of the protruding defect if the altered size of the protruding defect is larger than the threshold value, and wherein the supplying includes supplying the modified repair energy.

24. A defect repair method according to claim 21, wherein the finding includes finding an altered size of the protruding defect after the repair energy is supplied, wherein the calculating includes re-calculating a modified repair energy based on the altered size of the protruding defect, and wherein the supplying includes supplying the modified repair energy if the altered size of the protruding defect is larger than the threshold value.

25. A defect repair method according to claim 18, wherein the supplying of the calculated repair energy is in a manner such that the front surface of the multi-layer film is apart from the portion to which the repair energy is supplied.

26. A defect repair method according to claim 18, wherein the calculating of the repair energy includes calculating a heat quantity to be supplied by the supplying of the calculated repair energy.

27. A defect repair method according to claim 18, wherein the calculating of the repair energy includes calculating an energy density (E) based on equations:

$$Q=(4\pi(D/2)^3/3)*\rho*Cp\Delta T \text{ and}$$

$$E=Q/t/\epsilon/(\pi D^2/4),$$

where (Q) is a heat quantity, (D) is the size of the protruding defect, ($\rho$) is a density of the multi-layer film, (Cp) is a heat capacity of the multi-layer film, ($\Delta T$) is a target increase in temperature of the portion in the multi-layer film, (t) is a length of time for which the energy supplier supplies the repair energy, and ($\epsilon$) is an energy loss.

28. A defect repair method according to claim 27, further comprising determining whether the size of the protruding defect is larger than a threshold value, wherein the finding includes finding an altered size of the protruding defect after the repair energy is supplied, wherein the calculating of the repair energy includes re-calculating a modified repair energy by applying the altered size of the protruding defect to the equations, and wherein the supplying of the calculated repair energy includes supplying the modified repair energy if the altered size of the protruding defect is larger than the threshold value.

29. A defect repair method according to claim 28, wherein the re-calculating includes applying same values to variables in the equations at each time of the repeating of the supplying.

30. A defect repair method according to claim 28, wherein the re-calculating includes applying different values to variables in the equations at each time of the repeating of the supplying.

31. A computer readable media encoded with a computer program comprising instructions for controlling a computer to perform:
finding a size of a protruding defect on a front surface of a multi-layer film having a rear surface opposite to the front surface;
calculating a repair energy so as to repair the protruding defect based on a found size of the protruding defect; and
supplying a calculated repair energy to a portion in the multi-layer film from the rear surface of the multi-layer film so as to cause a decrease in a volume of the portion and retract the protruding defect into the multi-layer film.

* * * * *